US011956102B2

(12) United States Patent
Liu et al.

(10) Patent No.: US 11,956,102 B2
(45) Date of Patent: Apr. 9, 2024

(54) METHOD, APPARATUS AND DEVICE FOR SIMULTANEOUSLY SAMPLING MULTIPLE-CHANNEL SIGNALS, AND MEDIUM

(71) Applicant: Hangzhou Vango Technologies, Inc., Zhejiang (CN)

(72) Inventors: Yuyan Liu, Zhejiang (CN); Siqi Wang, Zhejiang (CN); Ling Lin, Zhejiang (CN); Nick Nianxiong Tan, Zhejiang (CN)

(73) Assignee: HANGZHOU VANGO TECHNOLOGIES, INC., Zhejiang (CN)

( * ) Notice: Subject to any disclaimer, the term of this patent is extended or adjusted under 35 U.S.C. 154(b) by 0 days.

(21) Appl. No.: 17/499,915

(22) Filed: Oct. 13, 2021

(65) Prior Publication Data
US 2023/0028586 A1 Jan. 26, 2023

(30) Foreign Application Priority Data
Jul. 23, 2021 (CN) .......................... 202110837865.3

(51) Int. Cl.
H04L 25/02 (2006.01)
H03H 17/06 (2006.01)

(52) U.S. Cl.
CPC ..... *H04L 25/0204* (2013.01); *H03H 17/0671* (2013.01); *H04L 25/022* (2013.01)

(58) Field of Classification Search
CPC ...... H03M 3/496; H03M 3/466; H03M 3/324; H04B 1/0064; H04B 7/0885; H04B 1/707;
(Continued)

(56) References Cited

U.S. PATENT DOCUMENTS 5,659,314 A * 8/1997 Tokura .................... H03M 3/43
341/172
6,263,195 B1 * 7/2001 Niu .......................... H04B 1/28
455/150.1

(Continued)

FOREIGN PATENT DOCUMENTS

CN 1322062 A 11/2001
CN 102082574 A 6/2011
(Continued)

OTHER PUBLICATIONS

Bonnie Baker "Delta-sigma ADCs in a nutshell Part one of a three-part series exploring the basic topology and functions of delta-sigma ADCs", Dec. 14, 2007, pp. 1-5. (Year: 2007).*

(Continued)

*Primary Examiner* — Sophia Vlahos
(74) *Attorney, Agent, or Firm* — Yue (Robert) Xu; Apex Attorneys at Law, LLP

(57) ABSTRACT

A method, an apparatus and a device for simultaneously sampling multiples signals and a medium are provided. The method includes: modulating multiple target input signals with CDM, to obtain a single target analog signal; performing $\Delta\Sigma$ modulation on the single target analog signal to obtain a target digital bit stream; demodulating the target digital bit stream to obtain a target demodulated bit stream; and filtering the target demodulated bit stream to obtain multiple target output signals. With the method, the hardware overhead for simultaneous sampling of multiple-channel signals is reduced while ensuring accuracy. Accordingly, the apparatus and the device, and the medium have the above beneficial effects.

13 Claims, 8 Drawing Sheets

(58) Field of Classification Search
CPC ............... H04L 25/0206; H04L 25/022; H04L 25/0204; H03H 17/0671; H04J 13/004
See application file for complete search history.

(56) References Cited

U.S. PATENT DOCUMENTS

| | | | | |
|---|---|---|---|---|
| 6,639,946 | B2* | 10/2003 | Wu | H03M 3/404 375/247 |
| 7,075,968 | B1* | 7/2006 | Ghassemzadeh | H04J 13/0022 375/130 |
| 8,320,408 | B2* | 11/2012 | Tzeng | H04B 1/707 370/479 |
| 8,537,745 | B2* | 9/2013 | Rimini | H04B 1/707 370/328 |
| 10,840,933 | B2* | 11/2020 | Ali | H03M 1/186 |
| 10,841,033 | B2* | 11/2020 | Kilambi | H04B 1/707 |
| 11,342,930 | B2* | 5/2022 | Ali | H03M 1/1033 |
| 2001/0033240 | A1 | 10/2001 | Ueno et al. | |
| 2013/0114588 | A1* | 5/2013 | Kyperountas | H04B 1/0064 375/267 |
| 2016/0329949 | A1* | 11/2016 | Cloutier | H04B 7/0885 |
| 2018/0309602 | A1* | 10/2018 | Zheng | H04B 1/0028 |
| 2021/0159888 | A1* | 5/2021 | Chen | H03H 17/0671 |

FOREIGN PATENT DOCUMENTS

| | | |
|---|---|---|
| CN | 106027060 A | 10/2016 |
| CN | 108199718 A | 6/2018 |
| CN | 112543026 A | 3/2021 |

OTHER PUBLICATIONS

The 1st Office Action regarding Chinese Patent Application No. CN202110837865.3, Mailing date: May 24, 2023.

* cited by examiner $$W = \begin{pmatrix} +1 & +1 & +1 & +1 & +1 & +1 & +1 & +1 \\ +1 & -1 & +1 & -1 & +1 & -1 & +1 & -1 \\ +1 & +1 & -1 & -1 & +1 & +1 & -1 & -1 \\ +1 & -1 & -1 & +1 & +1 & -1 & -1 & +1 \\ +1 & +1 & +1 & +1 & -1 & -1 & -1 & -1 \\ +1 & -1 & +1 & -1 & -1 & +1 & -1 & +1 \\ +1 & +1 & -1 & -1 & -1 & -1 & +1 & +1 \\ +1 & -1 & -1 & +1 & -1 & +1 & +1 & -1 \end{pmatrix}$$

Figure 3

| Multiplexing Technique | Multi-AD | PTIM | STIM | FDM | OFDM | CDM-$\Delta\Sigma$ |
|---|---|---|---|---|---|---|
| Number of Channels | N | N | N | N | N | N |
| Number of ADC | N | 1 | 1 | 1 | 1 | 1 |
| ADC Sampling Frequency (Nyquist) | $2*BW_{CH}$ | $2N*BW_{CH}$ | $2N*BW_{CH}$ | $6N*BW_{CH}$ | $2^N*BW_{CH}$ | $2.257\sqrt{N^2-1}*BW_{CH}$ |
| ADC ENOB Requirement | $ENOB_{CH}$ | $ENOB_{CH}$ | $ENOB_{CH}$ | $ENOB_{CH}+\log_2(N)$ | $ENOB_{CH}+\log_2(N)$ | $ENOB_{CH}+\log_2(N)$ |
| No Requirement for Multiple AFEs | × | × | √ | √ | √ | √ |
| Simultaneous Sampling | √ | √ | × | √ | √ | √ |

Figure 7

METHOD, APPARATUS AND DEVICE FOR SIMULTANEOUSLY SAMPLING MULTIPLE-CHANNEL SIGNALS, AND MEDIUM

The present application claims priority to Chinese Patent Application No. 202110837865.3, titled "METHOD, APPARATUS AND DEVICE FOR SIMULTANEOUSLY SAMPLING MULTIPLE-CHANNEL SIGNALS, AND MEDIUM", filed on Jul. 23, 2021 with the China National Intellectual Property Administration, which is incorporated herein by reference in its entirety.

FIELD

The present disclosure relates to the technical field of integrated circuits, and in particular to a method, an apparatus and a device for simultaneously sampling multiple-channel signals, and a medium.

BACKGROUND

At present, simultaneous sampling of multiple-channel signals plays a pivotal role in various application scenarios. For example, in power monitoring, in order to accurately monitor a power grid in real time, accurate simultaneous sampling is required for three-phase alternating current.

In the conventional technology, simultaneous sampling of multiple-channel signals generally requires multiple analog to digital converters (ADC), linearly increasing the chip area and power consumption with an increase in the number of channels. Parallel time interleaving multiplexing (PTIM), serial time interleaving multiplexing (STIM), frequency division multiplexing (FDM) and orthogonal frequency division multiplexing (OFDM) are proposed to use a single ADC to convert multiple inputs. However, PTIM requires multiple sample and hold circuits and large sampling capacitors, and STIM loses the temporal information and needs digital calibration to achieve simultaneous sampling. These all require high hardware overhead. Further, FDM and OFDM have very high requirements for a sampling rate of the ADC, so that it is difficult to use oversampling technique to realize high-accuracy. At present, there is no effective solution to the technical problem.

Therefore, how to reduce the hardware overhead for simultaneous sampling of multiple-channel signals while ensuring high-accuracy is a technical problem that to be urgently solved by those skilled in the art.

SUMMARY

In view of the above, a method, an apparatus and a device for simultaneously sampling multiples signals and a medium are provided according to the present disclosure, to reduce the hardware overhead for simultaneous sampling of multiple-channel signals while ensuring high-accuracy. The technical solutions are described below.

A method for simultaneously sampling multiple-channel signals is provided. The method includes: modulating multiple target input signals with a code division multiplexing (CDM) modulation module, to obtain a single target analog signal; performing Delta-Sigma ($\Delta\Sigma$) modulation on the single target analog signal to obtain a target digital bit stream; demodulating the target digital bit stream with the same code of CDM modulation to obtain a target demodulated bit stream; and filtering the target demodulated bit stream to obtain multiple target output signals.

In an embodiment, the modulating multiple target input signals with CDM to obtain a single target analog signal includes: modulating the multiple target input signals with the CDM based on an orthogonal coding matrix, to obtain the single target analog signal.

In an embodiment, the performing $\Delta\Sigma$ modulation on the single target analog signal to obtain a target digital bit stream includes: performing the $\Delta\Sigma$ modulation on the single target analog signal in a case that the single target analog signal is continuous, to obtain the target digital bit stream.

In an embodiment, the performing $\Delta\Sigma$ modulation on the single target analog signal to obtain a target digital bit stream includes: sampling the single target analog signal by an asymmetric clock switch capacitor circuit, to obtain a target discrete signal; and performing the $\Delta\Sigma$ modulation on the target discrete signal to obtain the target digital bit stream.

In an embodiment, the filtering the target demodulated bit stream to obtain multiple target output signals includes: filtering, in a case that frequencies of the multiple target input signals are less than a first predetermined frequency, the target demodulated bit stream by a cascade integrator comb (CIC) filter, to obtain the multiple target output signals.

In an embodiment, the filtering the target demodulated bit stream to obtain multiple target output signals includes: filtering, in a case that frequencies of the multiple target input signals are greater than a second predetermined frequency, the target demodulated bit stream by a half band filter (HBF), to obtain the multiple target output signals.

In an embodiment, the demodulating the target digital bit stream to obtain a target demodulated bit stream includes: demodulating the target digital bit stream with the CDM demodulation module, to obtain the target demodulated bit stream.

An apparatus for simultaneously sampling multiple-channel signals is further provided according to the present disclosure. The apparatus includes a first modulation module, a second modulation module, a data demodulation module and a data filtering module. The first modulation module is configured to modulate multiple target input signals with CDM, to obtain a single target analog signal. The second modulation module is configured to perform $\Delta\Sigma$ modulation on the single target analog signal to obtain a target digital bit stream. The data demodulation module is configured to demodulate the target digital bit stream to obtain a target demodulated bit stream. The data filtration module is configured to filter the target demodulated bit stream to obtain multiple target output signals.

A device for simultaneously sampling multiple-channel signals is further provided according to the present disclosure. The device includes a memory and a processor. The memory is configured to store a computer program. The processor is configured to execute the computer program to perform the method for simultaneously sampling multiple-channel signals described above.

A computer readable storage medium is further provided according to the present disclosure. The computer readable storage medium stores a computer program that, when being executed by a processor, performs the method for simultaneously sampling multiple-channel signals described above.

It can be seen that in the present disclosure, with the CDM, the multiple target input signals are modulated into a single analog signal with a low frequency, so that the simultaneous sampling of multiple-channel signals is performed via only one analog-to-digital conversion path, and the analog-to-digital conversion has high-accuracy, thereby significantly reducing the hardware overhead for sampling the multiple-channel signals. Furthermore, ΔΣ modulation is performed on the single target analog signal to obtain the target digital bit stream, and the target digital bit stream is demodulated to obtain the target demodulated bit stream, which is equivalent to that noise shaping is performed on the single target analog signal, so that multiple target output signal have high-accuracy of simultaneous sampling. In addition, the target demodulated bit stream is filtered to filter out the crosstalk signal in the target demodulated bit stream, so that the simultaneous sampling accuracy of the multiple target output signal is further improved. In summary, with the method for simultaneously sampling multiple-channel signals according to this embodiment, the hardware overhead for simultaneous sampling of multiple-channel signals is reduced while ensuring accuracy. Accordingly, the apparatus and the device for simultaneous sampling on of multiple-channel signals, and the medium according to the present disclosure have the above beneficial effects.

BRIEF DESCRIPTION OF THE DRAWINGS

In order to more clearly describe the technical solutions in the embodiments of the present disclosure or the technical solutions in the conventional technology, drawings to be used in the description of the embodiments of the present disclosure or the conventional technology are briefly described hereinafter. It is apparent that the drawings described below show merely the embodiments of the present disclosure, and those skilled in the art may obtain other drawings according to the provided drawings without any creative effort.

FIG. 3 is a schematic diagram showing a Walsh coding matrix;

FIG. 7 is a diagram showing comparison of parameters of simultaneous sampling of multiple input signals with different simultaneous sampling methods;

DETAILED DESCRIPTION OF THE EMBODIMENTS

Technical solutions of the embodiments of the present disclosure are clearly and completely described below in conjunction with the drawings of the embodiments of the present disclosure. Apparently, the embodiments described in the following are only some rather than all of the embodiments the present disclosure. Any other embodiments obtained by those skilled in the art based on the embodiments in the present disclosure without any creative effort fall within the protection scope of the present disclosure.

Figure 1:
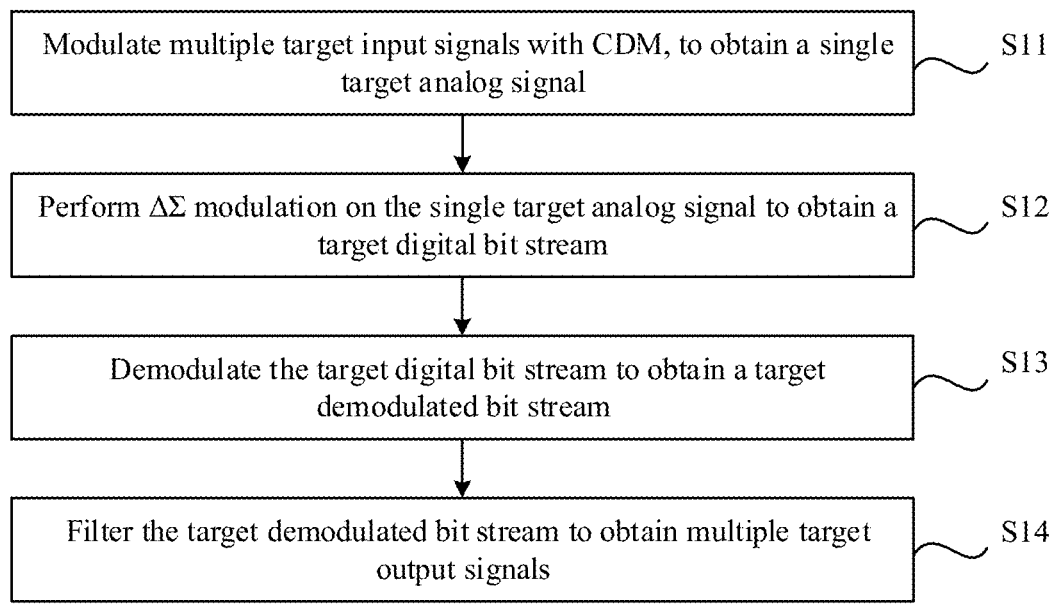
FIG. 1 is a flowchart of a method for simultaneously sampling of multiple-channel signals according to an embodiment of the present disclosure.

Reference is made to FIG. 1, which is a flowchart of a method for simultaneously sampling multiple-channel signals according to an embodiment of the present disclosure. The method includes the following steps S11 to S14.

In step S11, multiple target input signals are modulated with a code division multiplexing (CDM) modulation module, to obtain a single target analog signal.

In step S12, Delta-Sigma (ΔΣ) modulation is performed on the single target analog signal to obtain a target digital bit stream.

In step S13, the target digital bit stream is CDM-demodulated to obtain a target demodulated bit stream.

In step S14, the target demodulated bit stream is filtered to obtain multiple target output signals.

Figure 2:
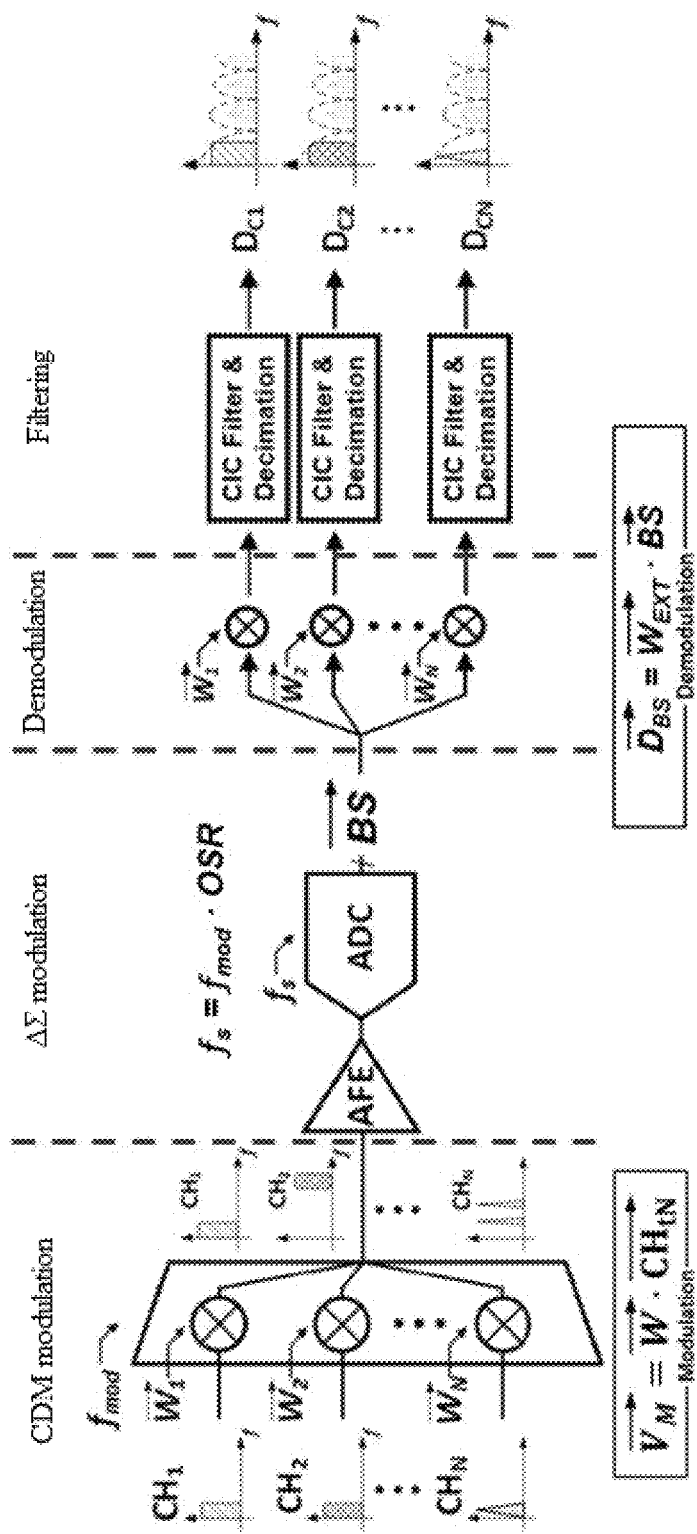
FIG. 2 is a schematic diagram showing simultaneous sampling of target multiple input signals according to an embodiment of the present disclosure.

In this embodiment, a method for simultaneously sampling multiple-channel signals is provided. With the method, the hardware overhead required for simultaneous sampling of multiple-channel signals is reduced while ensuring the accuracy of simultaneous sampling of multiple-channel signals. Reference is made to FIG. 2, which is a schematic diagram showing simultaneous sampling of multiple target input signals according to an embodiment of the present disclosure.

In the method, the multiple target input signals are modulated with the CDM modulation module, to obtain the single target analog signal. It can be understood that the multiple target input signals are modulated into the single analog signal with the CDM, so that a simultaneous sampling system performs simultaneous sampling on the multiple target input signals via only one analog-to-digital conversion path, so as to reduce the hardware overhead required for simultaneous sampling of the multiple target input signals. In addition, with the method, not only the cost and power consumption of the simultaneous sampling system are reduced, but also a problem of process variation among multiple analog-to-digital conversion paths is avoided.

Moreover, simultaneous sampling is performed strictly by modulating the multiple target input signals with the CDM without simultaneous calibration on the signals in a digital domain. Furthermore, the multiple target input signals are modulated with the CDM without multiple sample-and-hold modules, thereby reducing a volume of the simultaneous sampling system.

After the single target analog signal is obtained, the ΔΣ modulation is performed on the single target analog signal, to obtain the target digital bit stream, which is equivalent to that noise shaping is performed on the single target analog signal, so that the target digital bit stream has high-accuracy in simultaneous sampling. Then, for acquiring multiple target output signals based on information carried by the target digital bit stream, the target digital bit stream is CDM-demodulated, to obtain the target demodulated bit stream. Finally, the target demodulated bit stream is filtered, so as to filter out a crosstalk signal in the target demodulated bit stream. In this way, multiple target output signals with high accuracy are obtained.

It can be seen that in this embodiment, with the CDM, the multiple target input signals are combined into the single analog signal with a low frequency, so that in simultaneous sampling of multiple-channel signals, high-accuracy analog-to-digital conversion is completed via only one analog-to-digital conversion path, thereby significantly reducing the hardware overhead required for sampling multiple-channel signals. Furthermore, the ΔΣ modulation is performed on the single target analog signal to obtain the target digital bit stream, and the target digital bit stream is demodulated to obtain the target demodulated bit stream, which is equivalent to that noise shaping is performed on the single target analog signal, so that the multiple target output signals have high-accuracy in simultaneous sampling. In addition, the target demodulated bit stream is filtered, so as to filter out the crosstalk signal in the target demodulated bit stream, thereby improving the simultaneous sampling accuracy of the multiple target output signals. In view of the above, with the method for simultaneously sampling multiple-channel signals according to this embodiment, the accuracy of simultaneous sampling of multiple-channel signals is ensured and the hardware overhead for simultaneous sampling of multiple-channel signals is reduced.

Based on the above embodiment, the technical solutions are further explained and optimized in this embodiment. In a preferred embodiment, the above step in which the multiple target input signals are modulated with CDM to obtain the single target analog signal includes: modulating the multiple target input signals with the CDM based on an orthogonal coding matrix, to obtain the single target analog signal.

In this embodiment, the multiple target input signals are modulated with the CDM based on the orthogonal coding matrix. A process of modulating the multiple target input signals is explained by taking a case in which the orthogonal coding matrix is a Walsh coding matrix as an example. Reference is made to FIG. 3, which is a schematic diagram showing a Walsh coding matrix. The Walsh coding matrix is described by taking eight input signals as an example. In the process of modulating multiple target input signals with the CDM, a CDM modulator modulates the multiple target input signals [$CH_1$, $CH_2$, ..., $CH_N$] at a modulation frequency of $f_{mod}$ based on a row vector in the Walsh coding matrix W, to obtain a single target analog signal $V_M$. The single target analog signal $V_M$ is expressed as follows.

$$V_M = W \cdot CH_{tN} = W \cdot \begin{bmatrix} CH_1 \\ CH_2 \\ ... \\ CH_N \end{bmatrix} = W \cdot \begin{bmatrix} CH_1(t_1) & CH_1(t_2) & ... & CH_1(t_N) \\ CH_2(t_1) & CH_2(t_2) & ... & CH_2(t_N) \\ ... & ... & ... & ... \\ CH_N(t_1) & CH_N(t_2) & ... & CH_N(t_N) \end{bmatrix}$$

In the process of modulating the multiple target input signals with the CDM, the multiple target input signals are respectively multiplied by elements in a row of the Walsh coding matrix W, and the obtained products are added together. A first time instant corresponds to a first row of the Walsh coding matrix W. At the first time instant, the eight signals are directly added together. A second time instant corresponds to the second row of the Walsh coding matrix W. At the second time instant, the second signal, the fourth signal, the sixth signal and the eighth signal each are flipped, and the flipped second signal, the flipped fourth signal, the flipped sixth signal, the flipped eighth signal, the first signal, the third signal, the fifth signal and the seventh signal are added together. A third time instant corresponds to the third row of the Walsh coding matrix W. At the third time instant, the third signal, the fourth signal, the seventh signal and the eighth signal each are flipped, and the flipped third signal, the flipped fourth signal, the flipped seventh signal, the flipped eighth signal, the first signal, the second signal, the fifth signal and the sixth signal are added together. An eighth time instant corresponds to the eighth row of the Walsh coding matrix W. At the eighth time instant, the second signal, the third signal, the fifth signal and the eighth signal each are flipped, and the flipped second signal, the flipped third signal, the flipped fifth signal, the flipped eighth signal, the first signal, the fourth signal, the sixth signal and the seventh signal are added together. A ninth time instant corresponds to the first row of the Walsh coding matrix W. At the ninth time instant, the eight signals are directly added together.

Apparently, with the technical solutions according to this embodiment, the multiple target input signals are combined into the single target analog signal with a low frequency.

Based on the above embodiment, the technical solutions are further explained and optimized in this embodiment. In a preferred embodiment, the above step in which $\Delta\Sigma$ modulation is performed on the single target analog signal to obtain the target digital bit stream includes: performing, in a case that the single target analog signal is continuous, the $\Delta\Sigma$ modulation on the single target analog signal, to obtain the target digital bit stream.

Figure 4:
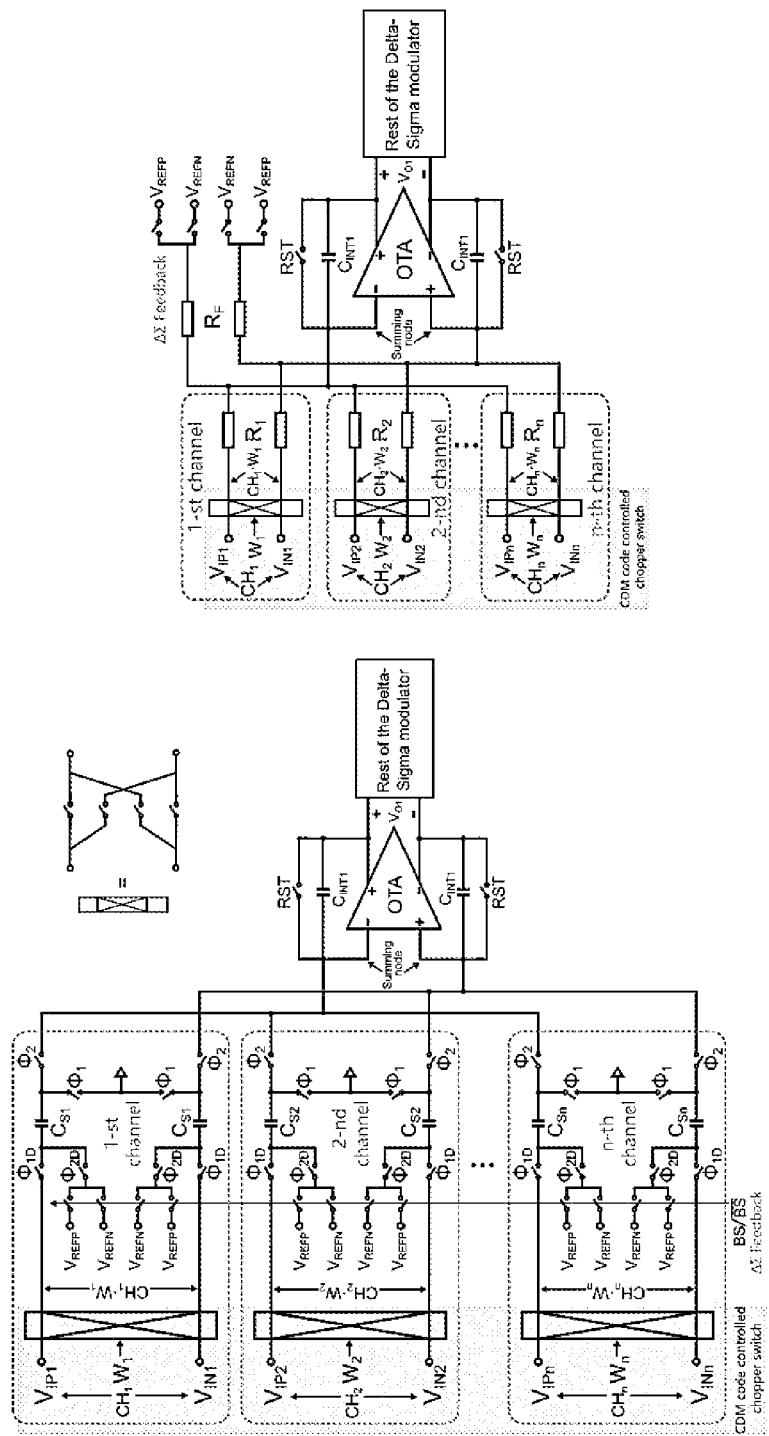
FIG. 4 is a structural schematic diagram showing a first order integrator in a Delta-Sigma (ΔΣ) modulator.

In practical application, in a case that the target single analog signal is continuous, the $\Delta\Sigma$ modulation is directly performed on the target single analog signal since addition in CDM modulation is directly performed in a first-order integrator of the $\Delta\Sigma$ modulator. Reference is made to FIG. 4, which is a structural schematic diagram of a first-order integrator of the $\Delta\Sigma$ modulator. In this case, since an amplitude of each signal is adjusted by adjusting a ratio of Csi (Ri) to Cf (that is, a ratio of a capacitance to another capacitance, or a ratio of a resistance to a capacitance in FIG. 4), a device such as a programmable gain amplifier in an analog front end (AFE) shown in FIG. 2 is unnecessary in some application scenarios. Therefore, the target digital bit stream is obtained by directly performing the $\Delta\Sigma$ modulation on the single target analog signal.

Moreover, experimental data indicates that the above processing further reduces the hardware overhead without affecting the output of the target digital bit stream.

In another preferred embodiment, the above step in which $\Delta\Sigma$ modulation is performed on the single target analog signal to obtain the target digital bit stream includes: sampling the single target analog signal by an asymmetric clock switch circuit, to obtain a target discrete signal; and performing $\Delta\Sigma$ modulation on the target discrete signal to obtain the target digital bit stream.

Figure 5:
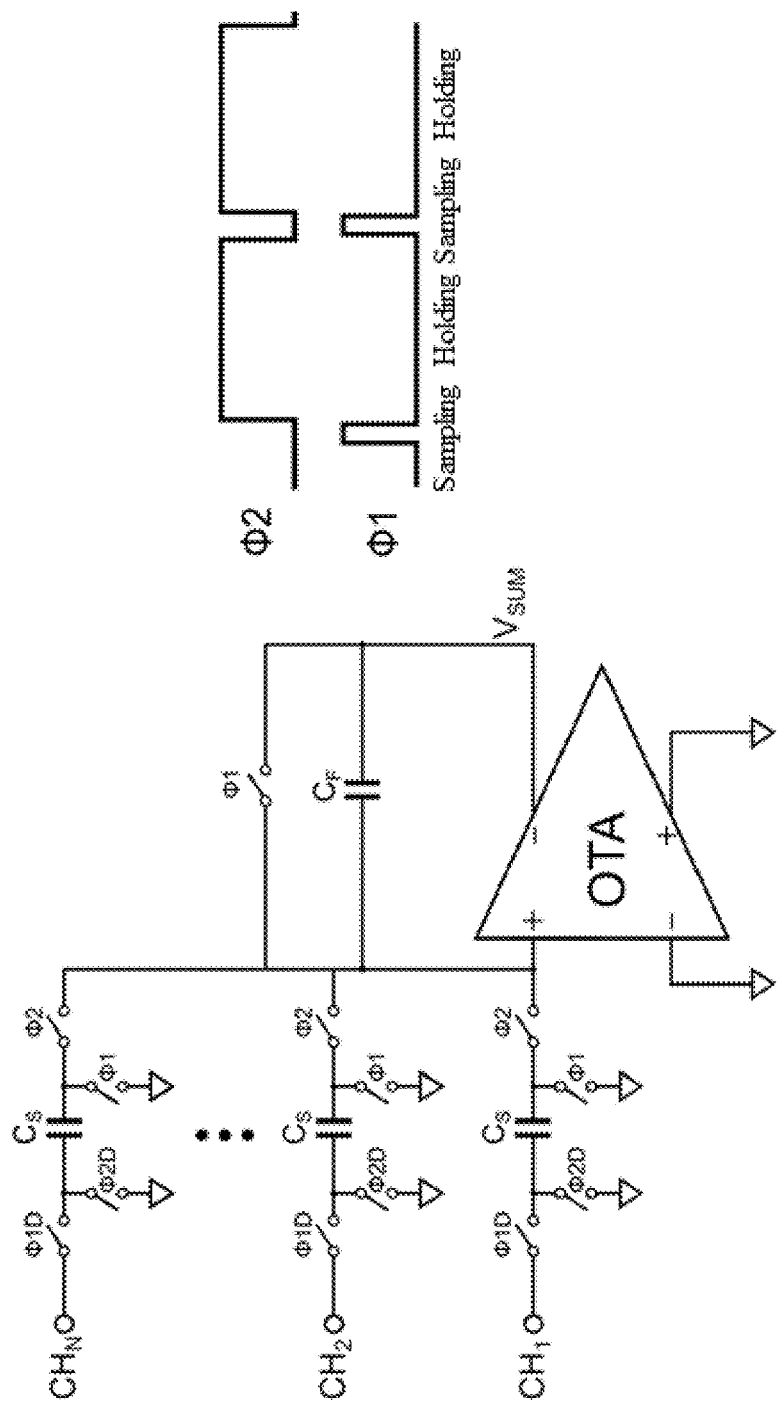
FIG. 5 shows a circuit diagram and a timing diagram of an asymmetric clock switch circuit.

In practical application, the target single analog signal can be sampled by the asymmetric clock switch circuit to obtain the target discrete signal. $\Delta\Sigma$ modulation is performed on the target discrete signal to obtain the target digital bit stream. Reference is made to FIG. 5, which shows a circuit diagram and a timing diagram of the asymmetric clock switch circuit. It can be understood that in an asymmetric clock signal, duration for sampling is reduced, and $\Delta\Sigma$ modulation is performed during holding, so that a frequency at which a signal is modulated with the CDM is not reduced. Compared with a clock signal having a duty cycle of 50%, the asymmetric clock signal nearly doubles the oversampling ratio of the $\Delta\Sigma$ modulation.

Here, $\Delta\Sigma$ modulation performed on the target single analog signal is described by taking a case in which a 1-bit quantizer serves as a $\Delta\Sigma$ modulator. In the $\Delta\Sigma$ modulation, the asymmetric clock switch circuit corresponding to the CDM modulator samples the target single analog signal at the modulation frequency of CDM, and the target discrete signal is obtained. Then, the $\Delta\Sigma$ modulator performs $\Delta\Sigma$ modulation on the target discrete signal at an oversampling ratio of $f_s$, and thus 1-bit digital bit stream subjected to $\Delta\Sigma$ modulation is obtained.

Based on the above embodiment, the technical solutions are further explained and optimized in this embodiment. In a preferred embodiment, the above step in which the target digital bit stream is demodulated to obtain the target demodulated bit stream includes: demodulating the target digital bit stream with the CDM, to obtain the target demodulated bit stream.

In this embodiment, the target digital bit stream is directly demodulated with the CDM to obtain the target demodulated bit stream, which reduces the resource overhead for demodulating the target digital bit stream compared with the processing in which the target digital bit stream is subject to ΔΣ demodulation and CDM demodulation sequentially.

In the process of demodulating the target digital bit stream with the CDM, a CDM decoder decodes the target digital bit stream at the modulation frequency of the CDM modulator. That is, the CDM decoder performs CDM decoding on the digital bit stream in a time period at the modulation frequency of the CDM modulator according to a row vector or a column vector of the Walsh coding matrix W.

If a time period corresponds to an element of 1 in the Walsh coding matrix W, the digital bit stream remains unchanged. If a time period corresponds to an element of −1 in the Walsh coding matrix W, the digital bit stream is flipped. For demodulating the first signal, the digital bit stream remains unchanged according to elements in the first row of the Walsh coding matrix W, to obtain a first output signal. For demodulating the second signal, according to elements in the second row of the Walsh coding matrix W, the digital bit stream is flipped at the second, the fourth, the sixth and the eighth time instants, and the digital bit stream remains unchanged at the first, the third, the fifth and the seventh time instants, to obtain a second output signal. For demodulating the third signal, according to elements in the third row of the Walsh coding matrix W, the digital bit stream is flipped at the third, the fourth, the seventh and the eighth time instants, and the digital bit stream remains unchanged at the first, the second, the fifth and the sixth time instants, to obtain a third output signal. In this way, the target digital bit stream is demodulated and the target demodulated bit stream is obtained.

Apparently, with the technical solutions according to this embodiment, the resource overhead for demodulating the target digital bit stream can be further reduced.

Based on the above embodiment, the technical solutions are further illustrated and optimized in this embodiment. In a preferred embodiment, the step in which the target demodulated bit stream is filtered to obtain multiple target output signals includes: filtering the target demodulated bit stream by a cascade integrator comb (CIC) filter in a case that frequencies of the multiple target output signal are less than a first predetermined frequency, to obtain the multiple target output signals.

In this embodiment, if the frequencies of the multiple target input signals are less than the first preset frequency, it indicates that the frequencies of the multiple target input signals are low. In this case, the target demodulated bit stream is filtered by the CIC filter, to obtain the multiple target output signals. A CIC filter with M samples per stage and N stages is expressed as:

$$H_{CIC}(z) = \left(\frac{1-z^{-N}}{1-z^{-1}}\right)^M.$$

After CDM modulation and ΔΣ modulation are performed on the multiple target input signals, interference between demodulation channels is concentrated at a half of the modulation frequency, a quarter of the modulation frequency, one eighth of the modulation frequency and three-eighths of the modulation frequency. In addition, there is an integral multiple relationship between the modulation frequency of the CDM modulation and the oversampling ratio of the ΔΣ modulation. The target demodulated bit stream is filtered by the CIC filter based on output spectrum characteristic of CDM modulation and ΔΣ modulation, which reduces the hardware overhead of a simultaneous sampling circuit.

Based on the above embodiment, the technical solutions are further illustrated and optimized in this embodiment. In a preferred embodiment, the step in which the target demodulated bit stream is filtered to obtain multiple target output signals includes: filtering the target demodulated bit stream by a half band filter (HBF) in a case that frequencies of the multiple target input signals are greater than a second predetermined frequency, to obtain the multiple target output signals.

If the frequencies of the multiple target input signals are greater than the second predetermined frequency, it indicates that the frequencies of the multiple target input signals are high. In this case, the target demodulated bit stream is filtered by the HBF. The HBF is commonly used in practical application. In addition, a filtering accuracy is high in filtering the target demodulated bit stream by the HBF. Therefore, in a case that the frequencies of the multiple target input signals are greater than the second predetermined frequency, the target demodulated bit stream is filtered by the HBF, to obtain the multiple target output signals.

Based on the technical solutions disclosed in the above embodiments, the simultaneous sampling of the multiple target input signals is described based on an example.

Figure 6:
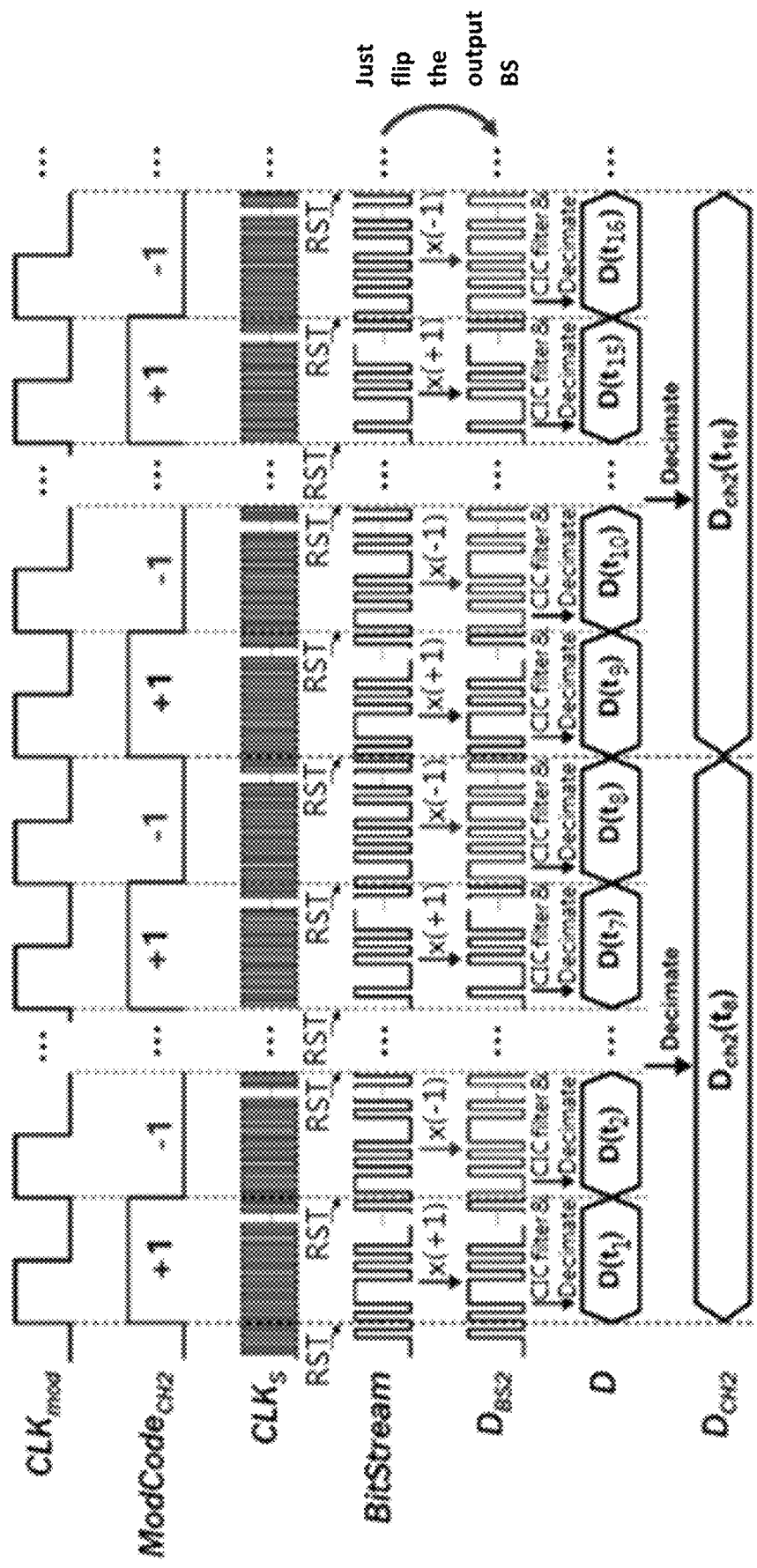
FIG. 6 is a timing diagram for simultaneous sampling of multiple input signals.

Reference is made to FIG. 6, which is a timing diagram for performing simultaneous sampling on the multiple target input signals. In a case that a bandwidth for the multiple target input signals is 17 kHz, the multiple target input signals are modulated at a modulation frequency of 280 kHz with the CDM and a frequency of 140 MHz with third-order ΔΣ modulation, and the modulated signal is filtered by a CIC filter with 4 samples per stage. In this way, signal to noise and distortion rates (SNDR) of the multiple target output signals reach 110 dB.

Reference is made to FIG. 7, which is a diagram showing comparison of parameters of simultaneous sampling of multiple input signals with different simultaneous sampling methods. It can be seen from FIG. 7 that, with the method for simultaneous sampling according to the present disclosure, the accuracy of a simultaneous sampling result is improved and the hardware overhead of a system for simultaneous sampling is reduced, which fully illustrates feasibility and reliability of the method for simultaneously sampling multiple-channel signals according to the embodiments of the present disclosure.

Figure 8:
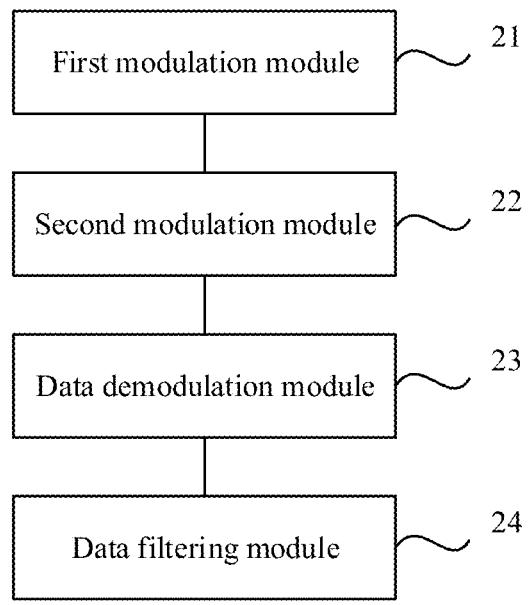
FIG. 8 is a structural schematic diagram showing an apparatus for simultaneously sampling multiple-channel signals.

Reference is made to FIG. 8, which is a structural schematic diagram of an apparatus for simultaneously sampling multiple-channel signals according to an embodiment of the present disclosure. The apparatus includes a first modulation module 21, a second modulation module 22, a data demodulation module 23, and a data filtering module 24.

The first modulation module 21 is configured to modulate multiple target input signals with CDM, to obtain a single target analog signal.

The second modulation module 22 is configured to perform ΔΣ modulation on the single target analog signal, to obtain a target digital bit stream.

The data demodulation module 23 is configured to demodulate the target digital bit stream to obtain a target demodulated bit stream.

The data filtering module 24 is configured to filter the target demodulated bit stream to obtain multiple target output signals.

The apparatus for simultaneously sampling multiple-channel signals according to this embodiment has the same the beneficial effects as the method for simultaneously sampling multiple-channel signals described above.

Figure 9:
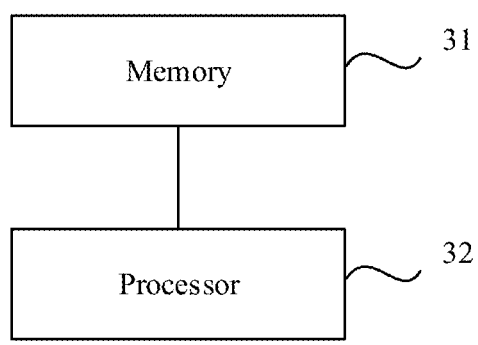
FIG. 9 is a structural schematic diagram showing a device for simultaneously sampling multiple-channel signals.

Reference is made to FIG. 9, which is a structural schematic diagram of a device for simultaneously sampling multiple-channel signals according to an embodiment of the present disclosure. The device includes a memory 31 and a processor 32.

The memory 31 is configured to stores a computer program.

The processor 32 is configured to execute the computer program to perform the method for simultaneously sampling multiple-channel signals described above.

The device for simultaneously sampling multiple-channel signals according to this embodiment has the same beneficial effects as the method for simultaneously sampling multiple-channel signals described above.

Accordingly, a computer readable storage medium is further provided according to an embodiment of the present disclosure. The computer readable storage medium stores a computer program that, when being executed by a processor, performs the method for simultaneously sampling multiple-channel signals described above.

The computer readable storage medium according to this embodiment of the present disclosure has the same beneficial effects as the method for simultaneously sampling multiple-channel signals described above.

The embodiments in this specification are described in a progressive way, each of which emphasizes the differences from others, and for the same or similar parts among the embodiments, one may refer to description of other embodiments. Since the apparatus disclosed in the embodiments is corresponds to the method therein, the description of the apparatus is relatively simple, and for relevant matters, one may refer to the description of the method embodiments.

It should be noted that in the present disclosure, relational terms such as "first" and "second" are merely used to distinguish one entity or operation from another entity or operation, but do not indicate or imply an actual relationship or order of these entities or operations. In addition, terms of "include", "comprise" or any other variants are intended to be non-exclusive. Therefore, a process, method, article or device including multiple elements includes not only the elements but also other elements that are not enumerated, or also include the elements inherent for the process, method, article or device. Unless expressively limited otherwise, the statement "comprising (including) one . . . " does not exclude the case that other similar elements may exist in the process, method, article or device.

The method, apparatus, and device for simultaneously sampling multiple-channel signals, and a medium according to the present disclosure are described in detail above. In the specification, examples are used to explain the principle and embodiments of the present disclosure, and the description of the above embodiments is only used to help understand the method and the core idea of the present disclosure. In addition, for those skilled in the art, variations may be made to the embodiments and the application scope. Therefore, the specification should not be understood as limitation to the present disclosure.

The invention claimed is:

1. A method for simultaneously sampling multiple-channel signals, comprising:

modulating multiple target input signals with code division multiplexing (CDM) to obtain a single target analog signal;

performing, by a Delta-Sigma (ΔΣ) modulator, ΔΣ modulation on the single target analog signal to obtain a target digital bit stream, wherein an adder for the CDM is integrated with a first-order integrator of the ΔΣ modulator;

CDM-demodulating the target digital bit stream to obtain a target demodulated bit stream; and filtering the target demodulated bit stream to obtain multiple target output signals.

2. The method for simultaneously sampling multiple-channel signals according to claim 1, wherein the modulating multiple target input signals with CDM to obtain a single target analog signal comprises:

modulating the multiple target input signals with the CDM based on an orthogonal coding matrix, to obtain the single target analog signal.

3. The method for simultaneously sampling multiple-channel signals according to claim 1, wherein the performing ΔΣ modulation on the single target analog signal to obtain a target digital bit stream comprises:

performing the ΔΣ modulation on the single target analog signal in a case that the single target analog signal is continuous, to obtain the target digital bit stream.

4. The method for simultaneously sampling multiple-channel signals according to claim 1, wherein the performing ΔΣ modulation on the single target analog signal to obtain a target digital bit stream comprises:

sampling the single target analog signal by an asymmetric clock switch capacitor circuit, to obtain a target discrete signal; and performing the ΔΣ modulation on the target discrete signal to obtain the target digital bit stream.

5. The method for simultaneously sampling multiple-channel signals according to claim 1, wherein the filtering the target demodulated bit stream to obtain multiple target output signals comprises:

filtering the target demodulated bit stream by a cascade integrator comb (CIC) filter in a case that frequencies of the multiple target input signals are less than a first predetermined frequency, to obtain the multiple target output signals.

6. The method for simultaneously sampling multiple-channel signals according to claim 1, wherein the filtering the target demodulated bit stream to obtain multiple target output signals comprises:

filtering the target demodulated bit stream by a half band filter (HBF) in a case that frequencies of the multiple target input signals are greater than a second predetermined frequency, to obtain the multiple target output signals.

7. The method for simultaneously sampling multiple-channel signals according to claim 1, wherein the CDM-demodulating the target digital bit stream to obtain a target demodulated bit stream comprises:

demodulating the target digital bit stream with the CDM, to obtain the target demodulated bit stream.

8. The method for simultaneously sampling multiple-channel signals according to claim 2, wherein the CDM-demodulating the target digital bit stream to obtain a target demodulated bit stream comprises:

demodulating the target digital bit stream with the CDM, to obtain the target demodulated bit stream.

9. The method for simultaneously sampling multiple-channel signals according to claim 3, wherein the CDM-demodulating the target digital bit stream to obtain a target demodulated bit stream comprises:

demodulating the target digital bit stream with the CDM, to obtain the target demodulated bit stream.

10. The method for simultaneously sampling multiple-channel signals according to claim 4, wherein the CDM-demodulating the target digital bit stream to obtain a target demodulated bit stream comprises:

demodulating the target digital bit stream with the CDM, to obtain the target demodulated bit stream.

11. The method for simultaneously sampling multiple-channel signals according to claim 5, wherein the CDM-demodulating the target digital bit stream to obtain a target demodulated bit stream comprises:

demodulating the target digital bit stream with the CDM, to obtain the target demodulated bit stream.

12. The method for simultaneously sampling multiple-channel signals according to claim 6, wherein the CDM-demodulating the target digital bit stream to obtain a target demodulated bit stream comprises:

demodulating the target digital bit stream with the CDM, to obtain the target demodulated bit stream.

13. An apparatus for simultaneously sampling multiple-channel signals, comprising:

a code division multiplexing (CDM) modulator configured to modulate multiple target input signals, to obtain a single target analog signal;

a Delta-Sigma ($\Delta\Sigma$) modulator configured to perform $\Delta\Sigma$ modulation on the single target analog signal to obtain a target digital bit stream, wherein an adder of the CDM modulator is integrated with a first-order integrator of the $\Delta\Sigma$ modulator;

a CDM demodulator configured to demodulate the target digital bit stream to obtain a target demodulated bit stream; and a data filter configured to filter the target demodulated bit stream to obtain multiple target output signals.

* * * * *